United States Patent
Misumi et al.

(10) Patent No.: US 8,975,759 B2
(45) Date of Patent: Mar. 10, 2015

(54) MANUFACTURING METHOD OF SEMICONDUCTOR DEVICE, ADHESIVE SHEET USED THEREIN, AND SEMICONDUCTOR DEVICE OBTAINED THEREBY

(75) Inventors: Sadahito Misumi, Ibaraki (JP); Takeshi Matsumura, Ibaraki (JP); Kazuhito Hosokawa, Ibaraki (JP); Hiroyuki Kondo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 180 days.

(21) Appl. No.: 13/615,221

(22) Filed: Sep. 13, 2012

(65) Prior Publication Data

US 2013/0020724 A1 Jan. 24, 2013

Related U.S. Application Data

(63) Continuation of application No. 12/829,707, filed on Jul. 2, 2010, now Pat. No. 8,278,153, which is a continuation of application No. 11/853,743, filed on Sep. 11, 2007, now Pat. No. 7,772,040.

(60) Provisional application No. 60/825,363, filed on Sep. 12, 2006.

(51) Int. Cl.
*H01L 23/28* (2006.01)
*H01L 25/065* (2006.01)
(Continued)

(52) U.S. Cl.
CPC ............ *H01L 25/0657* (2013.01); *H01L 25/50* (2013.01); *H01L 23/293* (2013.01); *H01L 2224/48091* (2013.01);
(Continued)

(58) Field of Classification Search
CPC .................................. H01L 21/56; H01L 23/28
USPC ......... 257/784, 107, 783, 676, 734, 743, 744, 257/753
See application file for complete search history.

(56) References Cited

U.S. PATENT DOCUMENTS

| 5,622,588 A | 4/1997 | Weber |
| 5,798,014 A | 8/1998 | Weber |

(Continued)

FOREIGN PATENT DOCUMENTS

| EP | 0 386 909 | 2/1990 |
| EP | 0 959 498 | 11/1999 |

(Continued)

OTHER PUBLICATIONS

Notification of Reasons for Refusal dated Nov. 9, 2012 in corresponding Japanese patent application No. 2012-092101.

(Continued)

*Primary Examiner* — Chuong A Luu
(74) *Attorney, Agent, or Firm* — Knobbe Martens Olson & Bear, LLP

(57) ABSTRACT

The present invention includes a temporary fixing step of temporarily fixing a semiconductor element on an adherend interposing an adhesive sheet therebetween, a wire-bonding step of bonding wires to the semiconductor element, and a step of sealing the semiconductor element with a sealing resin, and in which the loss elastic modulus of the adhesive sheet at 175-C is 2000 Pa or more.

7 Claims, 13 Drawing Sheets

(51) Int. Cl.
*H01L 25/00* (2006.01)
*H01L 23/29* (2006.01)

(52) U.S. Cl.
CPC .............. *H01L 2224/48227* (2013.01); *H01L 2224/73265* (2013.01); *H01L 2224/92247* (2013.01); *H01L 2225/0651* (2013.01); *H01L 2225/06575* (2013.01); *H01L 2924/01004* (2013.01); *H01L 2924/0102* (2013.01); *H01L 2924/01046* (2013.01); *H01L 2924/01079* (2013.01); *H01L 2924/3011* (2013.01); *H01L 2224/32145* (2013.01); *H01L 2224/32225* (2013.01); *H01L 2924/01019* (2013.01); *H01L 2224/32245* (2013.01); *H01L 2224/48247* (2013.01); *H01L 2924/10253* (2013.01); *H01L 2924/15747* (2013.01)
USPC ........... 257/784; 257/783; 257/743; 257/676; 257/734; 257/744; 257/753

(56) References Cited

U.S. PATENT DOCUMENTS

| | | |
|---|---|---|
| 6,214,640 B1 | 4/2001 | Fosberry et al. |
| 6,224,936 B1 | 5/2001 | Gochnour et al. |
| 6,265,782 B1 | 7/2001 | Yamamoto et al. |
| 6,303,219 B1 | 10/2001 | Sawamura et al. |
| 6,352,879 B1 | 3/2002 | Fukui et al. |
| 6,566,422 B1 | 5/2003 | Yagi et al. |
| 6,652,688 B2 | 11/2003 | Matsumura et al. |
| 7,232,709 B2 | 6/2007 | Misumi et al. |
| 7,772,040 B2 | 8/2010 | Misumi et al. |
| 8,236,614 B2 | 8/2012 | Misumi et al. |
| 8,278,153 B2 | 10/2012 | Misumi et al. |
| 2001/0022404 A1* | 9/2001 | Yamamoto et al. ........... 257/783 |
| 2003/0102573 A1* | 6/2003 | Tanabe et al. ................ 257/783 |
| 2003/0145949 A1* | 8/2003 | Tanaka et al. ................ 156/330 |
| 2005/0156321 A1 | 7/2005 | Misumi et al. |
| 2005/0227384 A1 | 10/2005 | Nagano et al. |
| 2006/0243947 A1 | 11/2006 | Tsumura et al. |
| 2006/0252234 A1 | 11/2006 | Saiki |
| 2007/0098995 A1 | 5/2007 | Masuko et al. |
| 2007/0205249 A1 | 9/2007 | Marsh et al. |
| 2012/0189845 A1 | 7/2012 | Misumi et al. |

FOREIGN PATENT DOCUMENTS

| | | |
|---|---|---|
| JP | 55-111151 | 8/1980 |
| JP | 5-095010 | 4/1993 |
| JP | 10-292163 | 11/1998 |
| JP | 10-335534 | 12/1998 |
| JP | 2000-104040 | 4/2000 |
| JP | 2001-223300 | 8/2001 |
| JP | 2001-313301 | 11/2001 |
| JP | 2002-093992 | 3/2002 |
| JP | 2002-105428 | 4/2002 |
| JP | 2002-118144 | 4/2002 |
| JP | 2002-134531 | 5/2002 |
| JP | 2002-179769 | 6/2002 |
| JP | 2002-261233 | 9/2002 |
| JP | 2003-264205 | 9/2003 |
| JP | 2003-297861 | 10/2003 |
| JP | 2004-043762 | 2/2004 |
| JP | 2005-19516 | 1/2005 |
| JP | 2005-183703 | 7/2005 |
| JP | 2008-205195 | 9/2008 |
| KR | 2000-0048963 | 7/2000 |
| KR | 2003-0014108 | 2/2003 |
| KR | 10-2004-0016855 | 2/2004 |
| TW | 288185 | 10/1996 |
| TW | 200502372 | 1/2005 |
| WO | WO 98/15975 | 6/1998 |
| WO | WO 02/089553 | 11/2002 |
| WO | WO 2004/030075 | 4/2004 |

OTHER PUBLICATIONS

Japanese Office Action issued by the Japanese Patent Office dated May 27, 2011 for corresponding Japanese Patent App. No. 2008-270166.
Japanese Office Action issued by the Japanese Patent Office dated Feb. 9, 2012 for corresponding Japanese Patent App. No. 2008-270166.
Decision of Refusal issued by the Japanese Patent Office dated May 8, 2012 for corresponding Japanese Patent App. No. 2008-270166.
Decision of Refusal issued on the corresponding Japanese Patent Application No. 2004-298470 by the Japanese Patent Office, dated Jan. 29, 2009.
http://en.wikipedia.org/wiki/Acrylic; http://en.wikipedia.org/wiki/Acryl_group.
International Search Report issued on the related PCT Application No. PCT/JP2006/302948, dated May 23, 2006.
Japanese Office Action issued on the corresponding Japanese Patent Application No. 2004-298470, dated Jul. 3, 2008.
Japanese Office Action issued on the corresponding Japanese Patent Application No. 2004-298470, dated Aug. 19, 2008.
Semiconductor OneSource Semiconductor Glossary: Wire Bonding.
Wolf et al. (Silicon Processing for the VLSI Era, vol. 1: Process Technology. $2^{nd}$ Ed. Sunset Beach: Lattice Press, 2000. 853, Fig. 17-7).

* cited by examiner

MANUFACTURING METHOD OF SEMICONDUCTOR DEVICE, ADHESIVE SHEET USED THEREIN, AND SEMICONDUCTOR DEVICE OBTAINED THEREBY

The present application is a continuation of U.S. patent application Ser. No. 12/829,707, filed Jul. 2, 2010 now U.S. Pat. No. 8,278,153, which is a continuation of U.S. patent application Ser. No. 11/853,743, filed Sep. 11, 2007, now issued U.S. Pat. No. 7,772,040, which claims priority to U.S. Provisional Application No. 60/825,363, filed Sep. 12, 2006. The disclosures of the above-referenced applications are incorporated by reference herein. This application also is related to U.S. patent application Ser. No. 11/816,696, filed Aug. 20, 2007, now issued U.S. Pat. No. 8,236,614, and U.S. patent application Ser. No. 12/492,641, filed Jun. 26, 2009 now Pat. No. 8,592,260.

BACKGROUND OF THE INVENTION

1. Field of the Invention

The present invention relates to a manufacturing method of a semiconductor device, an adhesive sheet used in the same method, and a semiconductor device obtained by the same method.

2. Description of the Related Art

In order to correspond to the demand of microminiaturization and realization of high functionality of a semiconductor device, the wiring width of a power line and the interval between signal lines arranged on the entire area of the major surface of a semiconductor chip (a semiconductor element) have been becoming narrow. Thereby, an increase of impedance and interference of signals between signal lines of different nodes occur, which become the cause at impeding the demonstration of sufficient performance in operation speed, degree of allowance in operation voltage, anti-electrostatic breakdown strength, and the like in the semiconductor chip. In order to solve these problems, a package structure is proposed in which the semiconductor element is layered (for example, refer to Japanese Patent Application Laid-Open (JP-A) Nos. 55-111151 and 2002-261233).

On the other hand, as a substance used when a semiconductor element is fixed onto a substrate or the like, an example using a thermosetting paste resin (for example, refer to JP-A No. 2002-179769) and an example using an adhesive sheet in which a thermoplastic resin and a thermosetting resin are combined (for example, refer to JP-A Nos. 2002-261233 and 2000-104040) are proposed.

In the conventional manufacturing method of a semiconductor device, an adhesive sheet or an adhesive is used at the time of adhesion of a semiconductor element and a substrate, a lead frame, or a semiconductor element. The adhesion is performed by compression bonding (die attaching) a semiconductor element and a substrate or the like, and then by curing an adhesive sheet or the like in a heating step. Further, wires are bonded to connect the semiconductor element and the substrate electrically, and then sealing with a sealing resin is performed by molding with the sealing resin and curing.

In recent years, the thickness of a semiconductor element has become thinner from the conventional thickness of 200 μm to less than 200 μm, and further to 100 μm or less, associated with thinning and miniaturization of the semiconductor element. When die attaching is performed using a semiconductor element of 100 μm or less, a warp may occur in the semiconductor element. As a result, there are cases where a gap is generated between the semiconductor element after die attaching and the adherend. When a semiconductor device is manufactured with a gap remaining, there is a problem that reliability of the device decreases.

SUMMARY OF THE INVENTION

The present invention has been made in view of the above-described problems, and an objective thereof is to provide a manufacturing method of a semiconductor device that is capable of manufacturing a highly reliable semiconductor device without changing the conventional manufacturing step, an adhesive sheet used in the same method, and a semiconductor device obtained by the same method.

The present inventors earnestly examined an adhesive sheet for manufacturing a semiconductor device, a semiconductor device obtained by using the sheet, and a manufacturing method thereof in order to solve the above-described conventional problems. As a result, it was found that the above objectives can be achieved by making the invention be configured as follows, and the present invention has been completed.

In order to solve the above-mentioned problems, the manufacturing method of a semiconductor device according to the present invention comprises a temporary fixing step of temporarily fixing a semiconductor element on an adherend interposing an adhesive sheet therebetween, a wire-bonding step of bonding wires to the semiconductor element, and a step of sealing the semiconductor element with a sealing resin, wherein the loss elastic modulus of the adhesive sheet at 175° C. is 2000 Pa or more.

According to the above-described method, the sealing resin is cured by heating in the sealing step, and the semiconductor element and the adherend are fixed together by interposing the adhesive sheet therebetween.

According to the above-described method, the method comprises a post-curing step of post-curing the sealing resin, wherein the sealing resin is cured by heating in the sealing step and/or the post-curing step, and the semiconductor element and the adherend are fixed together by interposing the adhesive sheet therebetween.

According to the above-described method, the sealing step is preferably performed in the range of 150° C. to 200° C.

According to the above-described method, the adhesion area between the semiconductor element and the adherend after sealing is preferably 90% or more.

According to the above-described method, the adherend is preferably a substrate, a lead frame, or a semiconductor element.

According to the above-described method, the method comprises preferably a step of laminating a spacer between semiconductor elements interposing the adhesive sheet therebetween in the case that the adherend is a semiconductor element.

According to the above-described method, the adhesive sheet used comprises preferably a thermoplastic resin.

According to the above-described method, an adhesive sheet including both a thermosetting resin and a thermoplastic resin is preferably used.

According to the above-described method, an acrylic resin is preferably used as the thermoplastic resin.

According to the above-described method, an epoxy resin and/or a phenol resin is preferably used as the thermosetting resin.

According to the above-described method, a cross-linking agent is preferably added to the adhesive sheet used.

In order to solve the above-mentioned problems, the adhesive sheet according to the present invention is an adhesive sheet used in the manufacturing method of a semiconductor device.

In order to solve the above-mentioned problems, the semiconductor device according to the present invention is a semiconductor device obtained by the semiconductor device producing process.

The present invention has effects described below with the means explained above.

That is, as in the conventional manufacturing method, in the case that a gap is generated between a semiconductor element and an adherend when the adhesive sheet is fixed from the beginning of pasting of the semiconductor element and the adherend, it becomes difficult to fill in the gap. The gap is generated caused by a state of being warped in a concave or convex shape associated with thinning of the semiconductor device. Therefore, in the present invention, pasting of the semiconductor element and the adherend is kept in a state that the adhesive sheet is temporarily fixed without being fixed completely. Then, the sheet is fixed in a sealing step of the semiconductor element. In this sealing step, when sealing with a resin is performed in the range of 150° C. to 200° C., for example, fluidity of the adhesive sheet gradually decreases and gets to a state of being fixed. In this process, pressure applied to the adhesive sheet from the sealing resin reduces the warp of the semiconductor element and acts as a force to fill in the gap. As a result, the semiconductor element is adhered and fixed to the adherend without a gap, and it becomes possible to manufacture a highly reliable semiconductor device.

The same effects and advantages as described above are produced in the case of laminating, over the above-mentioned semiconductor element, one or more semiconductor elements so as to interpose the same adhesive sheet (s) as described above between the semiconductor elements, or in the case of inserting a spacer between the above-mentioned semiconductor element and a semiconductor element as the above-mentioned object in such a manner that the adhesive sheet is interposed between each of the semiconductor elements and the spacer. The above-mentioned simplification of the producing process makes it possible to make the producing-efficiency of plural semiconductor elements or the like which are three-dimensional mounted even higher.

Figure 1A:
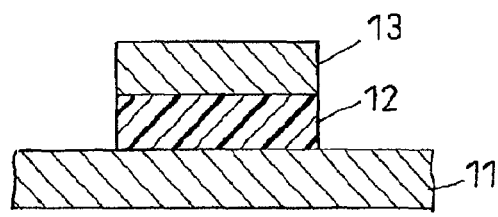
FIGS. 1A to 1C are process charts to explain the manufacturing method of a semiconductor device in embodiment 1 of the present invention.

DETAILED DESCRIPTION OF THE PREFERRED EMBODIMENTS (Embodiment 1)

The embodiments of the present invention are explained below referring to the drawings. However, portions unnecessary for the explanation are omitted, and there are portions shown in the drawings by magnifying, reducing, or the like to make the explanation easy.

Figure 1B:
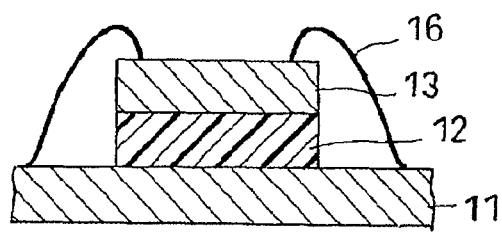
Figure 1C:
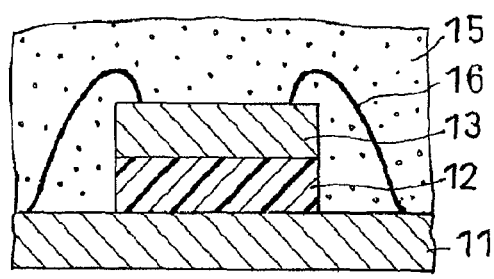

An embodiment of the present invention is explained referring to FIGS. 1A to 1C. FIGS. 1A to 1C are process charts to explain the manufacturing method of a semiconductor device according to the present embodiment. However, portions unnecessary for the explanation are omitted, and there are portions shown in the drawings by magnifying, reducing, or the like to make the explanation easy. The above-described statements are the same for the drawings below.

The semiconductor device producing process according to the present embodiment comprises a pre-sticking/fixing step of pre-sticking/fixing a semiconductor element 13 through an adhesive sheet 12 onto a substrate or lead frame (an object onto which the semiconductor element is to be stuck/fixed) 11, which will referred to merely as the "substrate 11 or the like" hereinafter, and a wire bonding step of performing wire bonding without heating step. This process further comprises a sealing step of sealing the semiconductor element 13 with a sealing resin 15, and a post-curing step of post-curing the sealing resin 15.

As illustrated in FIG. 1(a), the pre-sticking/fixing step is a step of pre-sticking/fixing the semiconductor element 13 through the adhesive sheet 12 onto the substrate 11 or the like. The method for pre-sticking/fixing the semiconductor substrate 13 onto the substrate 11 or the like may be, for example, a method of laminating the adhesive sheet 12 onto the substrate 11 or the like and subsequently laminating and pre-sticking/fixing the semiconductor element 13 on the adhesive sheet 12 in such a manner that the wire bonding face of the semiconductor element 13 is directed upwards. The semiconductor element 13 on which the adhesive sheet 12 is beforehand pre-stuck/fixed may be pre-stuck/fixed onto the substrate 11 or the like.

Moreover, in the present invention, the thickness of the semiconductor element 13 is not especially limited. Normally, its thickness is 200 μm or less. However, the present invention can correspond to a semiconductor element having a thickness of 100 m or less, and further, a thickness of 25 to 50 μm. When the thinned semiconductor element 13 is temporarily fixed to the substrate or the like 11, the semiconductor element 13 may be warped in a concave shape or a convex shape. As a result, a gap is generated between the substrate or the like 11 and the semiconductor element 13, and trouble occurs that a semiconductor device with high reliability cannot be obtained. However, in the present invention, the gap can be filled in as well as fixing the semiconductor element 13 to the substrate or the like 11 by performing a sealing step described later. The detail is described later.

The substrate may be any substrate known in the prior art. The lead frame may be a metal lead frame such as a Cu lead frame or a 42-alloy lead frame; or an organic substrate made of glass epoxy resin, BT (bismaleimide-triazine) polyimide or the like. In the present invention, however, the substrate is not limited to these substrates, and may be a circuit substrate that can be used in the state that a semiconductor element is mounted on the substrate itself and is electrically connected thereto.

As the adhesive sheet 12, a sheet having a loss elastic modulus at 175° C. of 2000 Pa or more is used, and more preferably a sheet in the range of 2000 to $1 \times 10^6$ Pa is used. The loss elastic modulus is a measure of energy added to a visco-elastic body that is lost as heat after the energy is stored once, and is expressed by converting the energy that is lost as heat into an elastic modulus. The energy loss is lost in the form of frictional energy, and the larger the friction is, the larger the energy loss becomes. The loss elastic modulus can be obtained by multiplying the dynamic viscosity by the angular frequency. Generally, when heat is applied to a resin composition, the loss elastic modulus increases together with its curing reaction. However, when curing proceeds to some degree and the resin composition becomes closer to a solid, the viscous component of the resin composition decreases and as a result, the dynamic viscosity begins to decrease. Therefore, the decrease of the loss elastic modulus means a state that the curing reaction proceeds to some degree and the resin composition starts to become a solid. In the present invention, because the loss elastic modulus at 175° C. of the adhesive sheet 12 is 2000 Pa or more, fluidity decreases and the resin composition becomes close to the state of being fixed in the sealing step described later. At this time, pressure applied in the sealing with a resin becomes a pressure to fill in the gap through the adhesive sheet that comes to have rigidity to some degree. As a result, a gap existing between the semiconductor element 13 and the substrate or the like 11 is decreased, and it becomes possible to manufacture a semiconductor device with high reliability. Further, it can correspond to further thinning of the semiconductor element.

The adhesive sheet 12 may be a adhesive sheet, the shear adhesive force of which to the substrate 11 or the like is 0.2 MPa or more, preferably from 0.2 to 10 MPa, at the time of the pre-sticking/fixing. The shear adhesive force of the adhesive sheet 12 is at least 0.2 MPa; therefore, even if a wire bonding step is performed without heating step, no shear deformation is generated in the adhesion face between the adhesive sheet 12 and the semiconductor element 13 or the substrate 11 or the like by ultrasonic vibration or heating in the wire bonding step. In other words, the semiconductor element is not shifted by ultrasonic vibration generated at the time of the wire bonding step, thereby preventing a drop in the success ratio of the wire bonding. The adhesive sheet 12 will be described in detail later.

The wire bonding step is a step of electrically connecting the tips of terminal portions (inner leads) of the substrate 11 or the like to electrode pads (not illustrated) on the semiconductor element 13 through bonding wires 16 (see FIG. 1(b)). The bonding wires 16 may be, for example, gold lines, aluminum lines, or copper lines. The temperature when the wire bonding is performed is from 80 to 250° C., preferably from 80 to 220° C. The time for the heating is from several seconds to several minutes. The bonding is performed by use of both of vibration energy based on ultrasonic waves and pressing energy based on applied pressure in the state that the semiconductor element 13 and the substrate 11 or the like are heated into the above-mentioned temperature range.

The present step is carried out without performing sticking/fixing based on the adhesive sheet 12. In the present step, the semiconductor element 13 is not stuck/fixed onto the substrate 11 or the like through the adhesive sheet 12. Even if the temperature for the wire bonding is in the range of 80 to 250° C., the shear adhesive force of the adhesive sheet 12 needs to be 0.2 MPa or more. If the shear adhesive force is less than 0.2 MPa within this temperature range, the semiconductor element is shifted by ultrasonic vibration at the time of the wire bonding. As a result, the wire bonding cannot be performed to give a low yield.

The above-mentioned sealing step is a step of sealing the semiconductor element 13 with a sealing resin 15 (see FIG. 1(c)), and is performed to protect the semiconductor element 13 and the bonding wires 16 mounted on the substrate 11 or the like. The present step is performed by molding the sealing resin with a mold or die. The sealing resin 15 may be, for example, an epoxy resin. The heating for the resin-sealing is performed usually at 175° C. for 60 to 90 seconds. In the this invention, however, the heating is not limited to this, and may be performed, for example at 150 to 200° C. for several minutes. Further, in this step, pressure may be applied at the time of the sealing with resin. In this case, the applied pressure is preferably 1 to 15 MPa, and further preferably 3 to 10 MPa. When the pressure in this range is applied, a gap existing between the semiconductor element 13 and the substrate or the like 11 can be certainly filled in. Thereby, the semiconductor element 13 and the substrate or the like 11 are fixed through the adhesive sheet 12, and a gap existing between both can be filled in. That is, in the present invention, even in the case that a post-curing step described later is not performed, the fixing by the adhesive sheet 12 is possible in this step, and the present invention can contribute to a reduction of the number of manufacturing steps and shortening of the manufacturing time of the semiconductor device. Here, the adhesion area of the substrate or the like 11 and the semiconductor element 13 is preferably 90% or more, and further preferably 95% or more. When the adhesion area is less than 90%, there is a case where trouble occurs in reliability of humidity resistance. The adhesion area refers to a region where the semiconductor element 13 and the substrate or the like 11 are contacting through the adhesive sheet 12, and the region where the adhesive sheet 12 is adhered to only either one of them is not included.

In the present invention, after the sealing step, a post-curing step may be performed in which sealing resin 15 is after-cured. In this step, sealing resin 15 insufficiently cured in the sealing step is cured completely. The heating temperature in this step differs according to the type of the sealing resin, and it is in the range of 150 to 200° C., for example. The heating time is about 0.5 to 8 hours.

Next, the adhesive sheet 12 is described in detail. The constitution of the adhesive sheet 12 is not especially limited as long as the loss elastic modulus at 175° C. is 2000 Pa or more. Specific examples include an adhesive sheet consisting of only a single layer of an adhesive layer and an adhesive sheet having a multi-layered structure in which the adhesive layer is formed on one surface or both surfaces of a core material. Examples of the core member include films (such as polyimide, polyester, polyethylene terephthalate, polyethylene naphthalate, and polycarbonate films); resin substrates which are reinforced with glass fiber or plastic nonwoven finer; silicon substrates; and glass substrates. Among these core materials, although depending on the combination with constituting materials of the adhesive layer, for example, a cross-linked thermoplastic resin is preferably used in order to have the loss elastic modulus at 175° C. of 2000 Pa or more. This is because fluidity decreases by cross-linking. The core member may be a member wherein an adhesive sheet is integrated with a dicing sheet.

The adhesive layer is a layer having an adhesive function, and the constituent material thereof may be a material composed of a thermoplastic resin and a thermosetting resin, or a material made only of a thermoplastic resin.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth) acrylate, 2-hydroxypropyl (meth) acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth) acrylamide-2-methylpropanesulfonic acid, (meth)acrylamidepropane sulfonic acid, sulfopropyl (meth)acrylate, and (meth) acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In the present invention, an adhesive sheet comprising the epoxy resin, the phenol resin, and an acrylic resin is particularly preferable. Since these resins contain ionic impurities in only a small amount and have high heat resistance, the reliability of the semiconductor element can be ensured. About the blend ratio in this case, the amount of the mixture of the epoxy resin and the phenol resin is from 10 to 200 parts by weight for 100 parts by weight of the acrylic resin component.

In order to crosslink the adhesive sheet 12 of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

An inorganic filler may be appropriately incorporated into the adhesive sheet 12 of the present invention in accordance with the use purpose thereof. The incorporation of the inorganic filler makes it possible to confer electric conductance to the sheet, improve the thermal conductivity thereof, and adjust the elasticity. Examples of the inorganic fillers include various inorganic powders made of the following: a ceramic such as silica, clay, plaster, calcium carbonate, barium sulfate, aluminumoxide, berylliumoxide, silicon carbide or silicon nitride; ametal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler is preferably from 0.1 to 80 μm.

The amount of the inorganic filler to be incorporated is preferably set into the range of 0 to 80% by weight (more preferably, 0 to 70% by weight) for 100 parts by weight of the organic resin components.

If necessary, other additives besides the inorganic filler may be incorporated into the adhesive sheet 12 of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

(Embodiment 2)

A process for producing a semiconductor device according to embodiment 2 is described with reference to FIGS. 2(a) to 2(e), which are process charts for explaining this process.

The semiconductor device according to the present embodiment is different from the semiconductor device according to the above-mentioned embodiment 1 in that plural semiconductor elements are laminated to be three-dimensionally mounted. More specifically, the present embodiment comprises the step of laminating, on a semiconductor element, another semiconductor element through the adhesive sheet as described above, which is different from the embodiment 1.

Figure 2A:
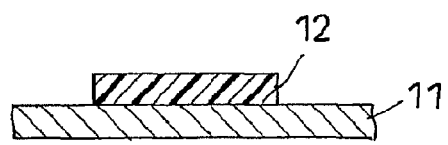
FIGS. 2A to 2E are process charts to explain the manufacturing method of a semiconductor device in embodiment 2 of the present invention.
Figure 2B:
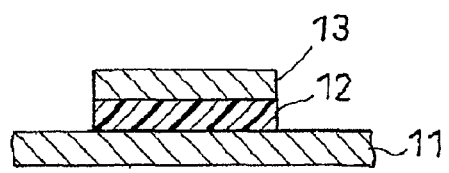
Figure 2C:
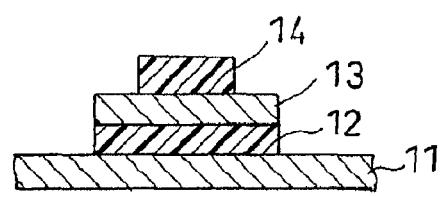
Figure 2D:
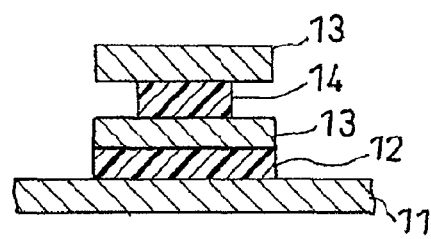

First, as illustrated in FIG. 2(a), at least one adhesive sheet 12, which is cut into a given size, is pre-stuck/fixed onto a substrate 11 or the like, which is an object on which the sheet 12 is to be stuck/fixed. Next, a semiconductor element 13 is pre-stuck/fixed onto the adhesive sheet 12 so that the wire bonding face thereof is directed upwards (see FIG. 2(b)). Furthermore, an adhesive sheet 14 is pre-stuck/fixed onto the semiconductor element 13 to avoid electrode pad portions of the element 13 (see FIG. 2(c)). Another semiconductor element 13 is then formed on the adhesive sheet 14 so that the wire bonding face thereof is directed upwards (see FIG. 2(d)).

Figure 2E:
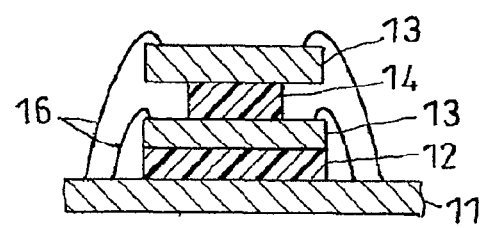

Next, as illustrated in FIG. 2(e), a wire bonding step is carried out without performing any heating step, thereby electrically connecting electrode pads of the semiconductor elements 13 to the substrate 11 or the like through bonding wires 16.

Successively, a sealing step to seal the semiconductor element 13 with a sealing resin is performed, the sealing resin is cured, and gaps generated between the substrate or the like 11 and the semiconductor element 13 and between the semiconductor elements 13 are filled in by the adhesive sheets 12 and 14. A post-curing step may be performed after the sealing step.

According to the present embodiment, about the three-dimensional mounting of the semiconductor elements, the production steps thereof can be made simple and the yield thereof can be improved as well, since no heating step based on the heating of the adhesive sheets 12 and 14 is performed. The semiconductor elements can be made even thinner, since the substrate 11 or the like is not warped and the semiconductor elements 13 are not cracked.

(Embodiment 3)

A process for producing a semiconductor device according to embodiment 3 is described with reference to FIGS. 3(a) to 3(g), which are process charts for explaining this process.

The semiconductor device according to the present embodiment is different from the semiconductor device related to the embodiment 2 in that a spacer is inserted between laminated semiconductor elements. More specifically, the present embodiment comprises the step of inserting a spacer between semiconductor elements in such a manner that an adhesive sheet is interposed between the spacer and each of the semiconductor elements, which is different from the embodiment 2.

Figure 3A:
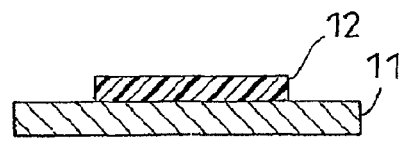
FIGS. 3A to 3G are process charts to explain the manufacturing method of a semiconductor device in embodiment 3 of the present invention.
Figure 3B:
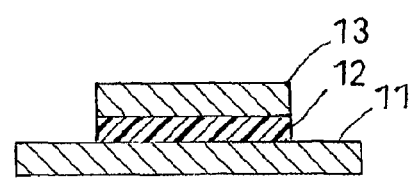
Figure 3C:
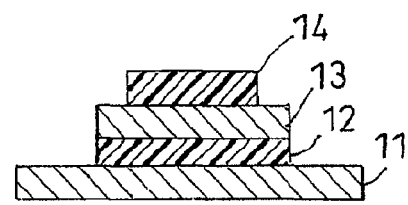
Figure 3D:
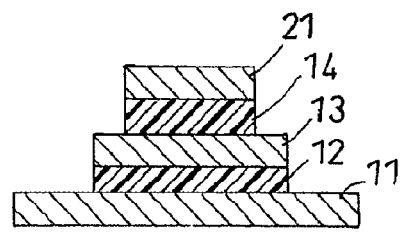
Figure 3E:
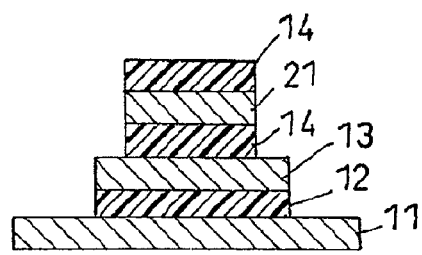
Figure 3F:
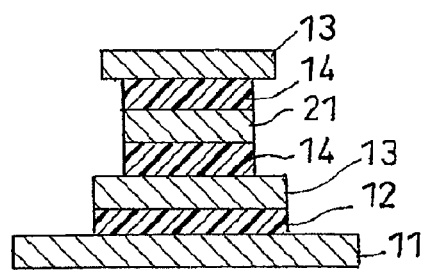

First, as illustrated in FIGS. 3(a) to 3(c), an adhesive sheet 12, a semiconductor element 13 and an adhesive sheet 14 are successively laminated and pre-stuck/fixed onto a substrate 11 or the like in the same way as in the embodiment 2. Furthermore, on the adhesive sheet 14, a spacer 21, another adhesive sheet 14 and another semiconductor element 13 are successively laminated and pre-stuck/fixed (see FIGS. 3(d) to 3(f)).

Figure 3G:
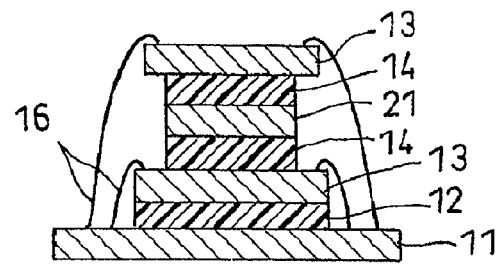

Next, as illustrated in FIG. 3(g), a wire bonding step is carried out without performing any heating step, thereby electrically connecting electrode pads of the semiconductor elements 13 to the substrate 11 or the like through bonding wires 16.

Next, a sealing step of sealing the semiconductor elements with a sealing resin is performed to cure the sealing resin and further stick/fix the substrate 11 or the like onto one of the semiconductors element 13 and stick/fix the other semiconductor element 13 onto the spacer 21 through the adhesive sheets 12 and 14. After the sealing step, a post-curing step may be performed. The above-mentioned producing process makes it possible to yield a semiconductor device according to the present embodiment.

The spacer is not limited to any especial kind, and may be a spacer known in the prior art, such a silicon chip or a polyimide film.

(Embodiment 4)

A process for producing a semiconductor device according to embodiment 4 is described with reference to FIGS. 4(a) to 4(e), which are process charts for explaining this process.

Figure 4A:
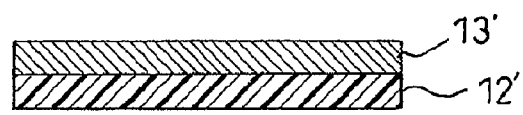
FIGS. 4A to 4E are process charts to explain the manufacturing method of a semiconductor device in embodiment 4 of the present invention.
Figure 4B:
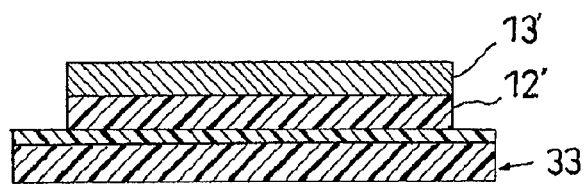
Figure 4C:
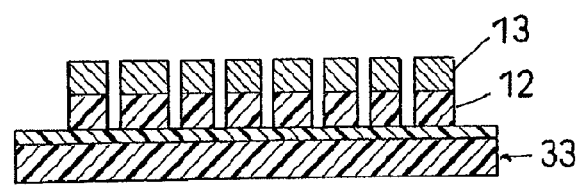

First, as illustrated in FIG. 4(a), an adhesive sheet 12' is stuck onto the rear face of a semiconductor wafer 13' to form a semiconductor wafer with the adhesive sheet. Next, a dicing tape 33 is pre-stuck/fixed onto the semiconductor wafer 13' (see FIG. 4(b)). The semiconductor wafer with the adhesive sheet is then diced into chips each having a given size (see FIG. 4(c)). The chips with the adhesive are peeled from the dicing tape 33.

Figure 4D:
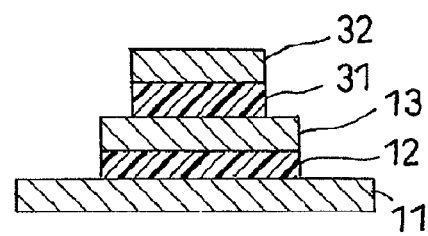

Next, as illustrated in FIG. 4(d), one 13 of the semiconductor elements with an adhesive sheet 12 is pre-stuck/fixed onto a substrate 11 or the like in such a manner that the wire bonding face thereof is directed upwards. A semiconductor element 32, which has a different size from that of the semiconductor element 13 and has an attached adhesive sheet 31, is pre-stuck/fixed onto the semiconductor element 13 in such a manner that the wire bonding face thereof is directed upwards.

Figure 4E:
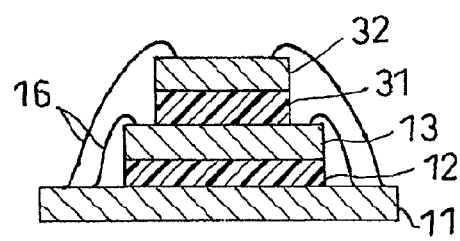

Next, as illustrated in FIG. 4(e), a wire bonding step is carried out without performing any heating step, thereby electrically connecting electrode pads of the semiconductor elements 13 and 32 to the substrate 11 or the like through bonding wires 16.

Next, a sealing step of sealing the semiconductor elements with a sealing resin is performed to cure the sealing resin and further to stick/fix the substrate 11 or the like onto the semiconductor 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

(Embodiment 5)

A process for producing a semiconductor device according to Embodiment 5 is described with reference to FIGS. 5(a) to 5(e), which are process charts for explaining this process.

The semiconductor device producing process according to the present embodiment is different from the semiconductor device producing process according to the embodiment 4 in that an adhesive sheet 12' is laminated onto a dicing tape 33 and subsequently a semiconductor wafer 13' is laminated onto the adhesive sheet 12'.

Figure 5A:
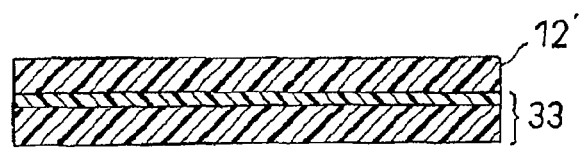
FIGS. 5A to 5E are process charts to explain the manufacturing method of a semiconductor device in embodiment 5 of the present invention.
Figure 5B:
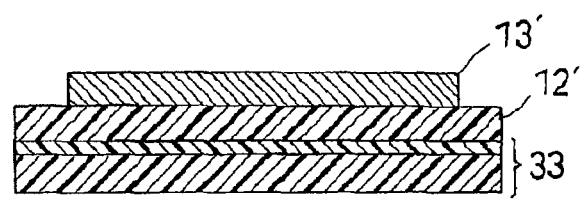
Figure 5C:
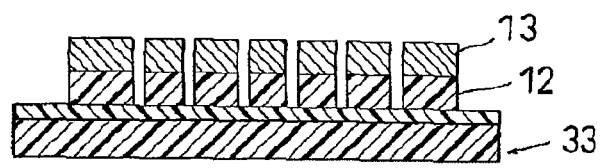

First, as illustrated in FIG. 5(a), an adhesive sheet 12' is laminated onto a dicing tape 33. A semiconductor wafer 13' is then laminated onto the adhesive sheet 12' (see FIG. 5(b)).

The semiconductor wafer with the adhesive sheet is then diced into chips each having a given size (see FIG. 5c)). The chips with the adhesive are peeled from the dicing tape 33.

Figure 5D:
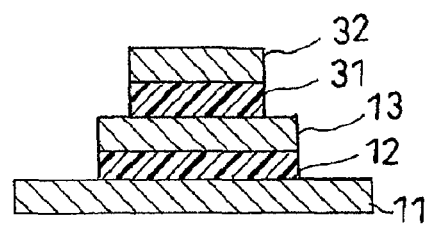

Next, as illustrated in FIG. 5(d), one 13 of the semiconductor elements with an adhesive sheet piece 12 is pre-stuck/fixed onto a substrate 11 or the like in such a manner that the wire bonding face thereof is directed upwards. A semiconductor element 32, which has a different size from that of the semiconductor element 13 and has an attached adhesive sheet 31, is pre-stuck/fixed onto the semiconductor element 13 in such a manner that the wire bonding face thereof is directed upwards. At this time, the sticking/fixing of the semiconductor element 32 is performed to avoid electrode pad portions of the subjacent semiconductor element 13.

Figure 5E:
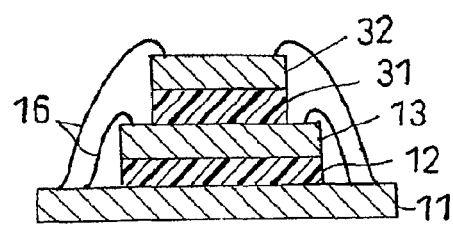

Next, as illustrated in FIG. 5(e), a wire bonding step is carried out without performing any heating step, thereby electrically connecting electrode pads of the semiconductor elements 13 and 32 to lands for internal connection in the substrate 11 or the like through bonding wires 16.

Next, a sealing step of sealing the semiconductor elements with a sealing resin is performed to cure the sealing resin and further to stick/fix the substrate 11 or the like onto the semiconductor element 13 and stick/fix the semiconductor element 13 onto the semiconductor element 32 through the adhesive sheet pieces 12 and 31. After the sealing step, a post-curing step may be performed. The above-mentioned producing process makes it possible to yield a semiconductor device according to the present embodiment.

(Embodiment 6)

Figure 6A:
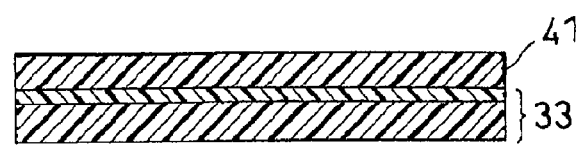
FIGS. 6A to 6C are process charts to explain the manufacturing method of a semiconductor device in embodiment 6 of the present invention.
Figure 6B:
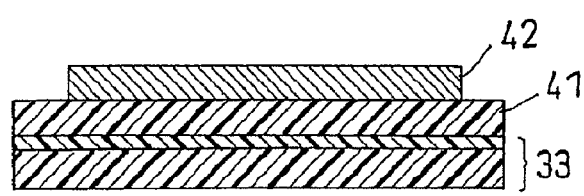
Figure 6C:
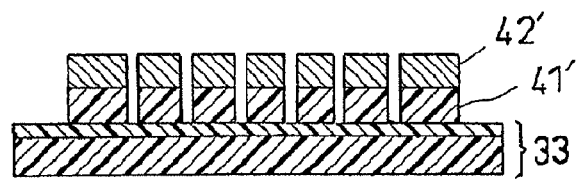
Figure 7:
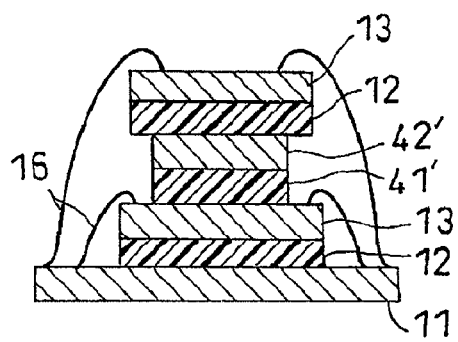
FIG. 7 is a cross-sectional view showing schematics of the semiconductor device obtained by the manufacturing method of a semiconductor device in the embodiment 6.

A process for producing a semiconductor device according to Embodiment 6 is described with reference to FIGS. 6(a) to 6(c) and FIG. 7. FIGS. 6(a) to 6(c) are process charts for explaining this process. FIG. 7 is a sectional view, which schematically illustrates a semiconductor device obtained by the semiconductor device producing process according to the present embodiment.

The semiconductor device according to the present embodiment is different from the semiconductor device according to the embodiment 3 in that a core member is used as a spacer.

First, an adhesive sheet 12' is laminated onto a dicing tape 33 in the same way as in the embodiment 5. A semiconductor wafer 13' is then laminated onto the adhesive sheet 12'. The semiconductor wafer with the adhesive sheet is then diced into chips each having a given size. The chips with the adhesive are peeled from the dicing tape 33, thereby yielding semiconductor elements 13 to each of which an adhesive sheet piece 12 is attached.

Separately, an adhesive sheet 41 is formed on a dicing tape 33, and then a core member 42 is attached onto the adhesive sheet 41. The resultant is then diced into chips each having a given size. The chips with the adhesive are peeled from the dicing tape 33, thereby yielding core member pieces 42' which are each in a chip form and each have an attached adhesive sheet piece 41'

Next, one of the semiconductor elements 13 is pre-stuck/fixed onto a substrate 11 or the like through the adhesive sheet 12 in such a manner that the wire bonding face thereof is directed upwards. Furthermore, one of the core member 42' is pre-stuck/fixed onto the semiconductor element 13 through the adhesive sheet 41'. Another element out of the semiconductor elements 13 is pre-stuck/fixed onto the core member 42' through the adhesive sheet 12 in such a manner that the wire bonding face thereof is directed upwards. The above-mentioned producing process makes it possible to yield a semiconductor device according to the present embodiment.

Next, a wire bonding step is carried out without performing any heating step, thereby electrically connecting electrode pads of the semiconductor elements 13 to lands for internal connection in the substrate 11 or the like through bonding wires 16 (see FIG. 7).

Next, a sealing step of sealing the semiconductor elements with a sealing resin is performed to cure the sealing resin and further to stick/fix the substrate 11 or the like onto one of the semiconductors element 13 and stick/fix the other semiconductor element 13 onto the core member piece 42' through the adhesive sheet 12 and 41'. After the sealing step, a post-curing step may be performed. The above-mentioned producing process makes it possible to yield a semiconductor device according to the present embodiment.

The core member is not limited to any especial kind, and may be a core member known in the prior art. Specific examples of the core member include films (such as polyimide film, polyester film, polyethylene terephthalate film, polyethylene naphthalate film, and polycarbonate film); resin substrates which are reinforced with glass fiber or plastic nonwoven finer; mirror silicon wafers; silicon substrates; and glass substrates.

(Embodiment 7)

Figure 8A:
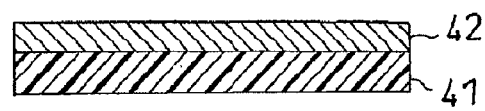
FIGS. 8A and 8B are process charts to explain the manufacturing method of a semiconductor device in embodiment 7 of the present invention.
Figure 8B:
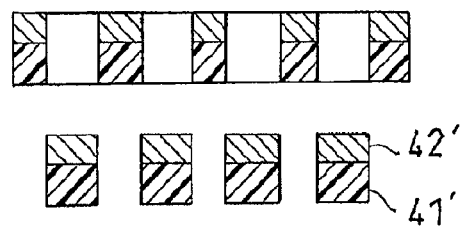

A process for producing a semiconductor device according to Embodiment 7 is described with reference to FIGS. 8(a) and 8(b), which are process charts for explaining this process.

The semiconductor device producing process according to the present embodiment is different from the semiconductor device producing process according to the embodiment 6 in that a core member is made into chips by punching or some other method instead of dicing.

First, semiconductor elements 13 each provided with an adhesive sheet 12 are yielded in the same way as in the embodiment 6. Separately, a core member 42 is attached onto an adhesive sheet 41. The resultant is made into chips each having a given size by punching or some other method. In this way, cores member 42' each of which is in a chip form and provided with an adhesive sheet 41' are yielded.

Next, one of the core member pieces 42' and one of the semiconductor elements 13 are successively laminated on another element out of the semiconductor elements 13 through the adhesive sheet pieces 12 and 41' and then are pre-stuck/fixed in the same way as that of Embodiment 6.

Furthermore, the resultant is subjected to a wire bonding step, a sealing step and an optional post-curing step, so as to yield a semiconductor device according to the present embodiment.

(Other Matters)

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

The laminating method of each of the above-mentioned embodiments is a mere example, and may be appropriately changed if necessary. For example, in the semiconductor device producing process according to the embodiment 2, the semiconductor elements in the second stage and higher stages may be laminated by the laminating method described about the embodiment 3.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

Below, preferred examples of the present invention are explained in detail. However, materials, addition amounts, and the like described in these examples are not intended to limit the scope of the present invention, and are only examples for explanation as long as there is no description of limitation in particular. In the examples, the word "part(s)" represent "part(s) by weight", respectively, unless otherwise specified.

EXAMPLE 1

Into methyl ethyl ketone were dissolved 100 parts of an acrylic ester type polymer made mainly of ethyl acrylate and methyl methacrylate (PARACRON W-197CM, manufactured by Negami Chemical Industrial Co., Ltd.), 3 parts of a polyfunctional isocyanate type crosslinking agent, 23 parts of an epoxy resin (Epikote 1004, manufactured by Japan Epoxy Resin Co., Ltd.), and 6 parts of a phenol resin (Milex XLC-CC, manufactured by Mitsui Chemicals, Inc. Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Example 1.

EXAMPLE 2

An adhesive sheet (thickness: 25 μm) according to Example 2 was formed in the same way as in Example 1 except that a polymer made mainly of butyl acrylate (PARACRON SN-710, manufactured by Negami Chemical Industrial Co., Ltd.) was used instead of the acrylic ester type polymer used in Example 1.

COMPARATIVE EXAMPLE 1

Into methyl ethyl ketone were dissolved 100 parts of the acrylic ester type polymer made mainly of ethyl acrylate and methyl methacrylate (PARACRON W-197CM, manufactured by Negami Chemical Industrial Co., Ltd.), 23 parts of the epoxy resin (Epikote 1004, manufactured by Japan Epoxy Resin Co., Ltd.), and 6 parts of the phenol resin (Milex XLC-LL, manufactured by Mitsui Chemicals, Inc.), so as to prepare an adhesive composition solution having a concentration of 20% by weight.

This adhesive composition solution was applied onto a release-treated film made of a polyethylene terephthalate film (thickness: 50 μm) treated for release with silicone as a releasing liner. The resultant was then dried at 120° C. for 3 minutes to form an adhesive sheet having a 25 μm of thickness according to Comparative Example 1.

COMPARATIVE EXAMPLE 2

An adhesive sheet (thickness: 25 μm) according to Comparative Example 2 was formed in the same way as in Comparative Example 1 except that the polymer made mainly of butyl acrylate (PARACRON SN-710, manufactured by Negami Chemical industrial Co., Ltd.) was used instead of the acrylic ester type polymer used in Comparative Example 1.

[Measurement of Loss Elastic Modulus]

The loss elastic moduli for the adhesive sheets produced in the examples and comparative examples were measured as follows.

The measurement was performed using a dynamic viscoelasticity measurement apparatus (RSAII, manufactured by Rheometric Scientific, Inc.). The measurement conditions were as follows; a sheet was cut into 10 mm in length×5 mm in width, the temperature was increased at 5° C./min at a fixed frequency (10 Hz) in a tensile mode, the measurement was performed at 30° C. to 250° C. and the loss elastic modulus at 175° C. was determined. Next, various types of samples for evaluation of adhesion area were produced for a substrate, a lead frame, and a semiconductor element.

That is, in the case of a substrate (trade name: TFBGA 16×16 (2216-001A01), manufactured by UniMicron Technology Corporation), after the obtained adhesive film was peeled off from a separator, the substrate cut into a 5 mm square was used. Meanwhile, a chip of 5 mm in length×5 mm in width×100 μm in thickness was produced by dicing a silicon wafer. This chip was temporarily fixed to the substrate to produce a test piece. The temporary fixing was performed by applying a load (0.25 MPa) at a temperature of 120° C. and under heating for 1 second using a die bonder (SPA-300, manufactured by Arakawa K. K.).

Further, also in the case of a lead frame (trade name: CA-F313 (MF202), manufactured by Shinko Electric Industries Co., Ltd.), a test piece was produced in the same manner as the above-described substrate.

Further, in the case of a semiconductor element, after the obtained adhesive sheet was peeled off from a separator, the semiconductor element cut into a 6 mm square was used. A silicon wafer diced into 6 mm in length×6 mm in width×300 μm in thickness was die-attached to a die pad of a lead frame (trade name: CA-F313 (MF202), manufactured by Shinko Electric Industries, Co., Ltd.). After that, a test piece was produced in which a chip diced into 5 mm in length×5 mm in width×100 μm in thickness from an aluminum deposited wafer was die-attached on the above-described element for evaluation using the above-described adhesive sheet cut into a 5 mm square. The die-attaching was performed in the same condition as the case of a substrate and a lead frame.

Next, a sealing step was performed with Auto Mold Press CPS-401 manufactured by Towa-Tec Corporation. The sealing was performed under the conditions of a mold temperature of 175° C., pre-heating of 3 seconds, curing time of 120 seconds, cramping pressure of 200 kN, and transfer pressure of 5 kN. GE-100 manufactured by Nitto Denko Corporation was used as the sealing resin.

The adhesion area was measured after the temporary fixing and after the sealing with an Ultrasonic Inspection System (Sono-Scan D-6000, manufactured by Nippon Barnes Company Ltd.). The results are shown in table 1 below.

TABLE 1

|  | Loss Elastic Modulus (Pa) | Lead Frame | | Substrate | | Semiconductor Element | |
| --- | --- | --- | --- | --- | --- | --- | --- |
|  |  | Adhesion Area After Temporary Fixing (%) | Adhesion Area After Sealing (%) | Adhesion Area After Temporary Fixing (%) | Adhesion Area After Sealing (%) | Adhesion Area After Temporary Fixing (%) | Adhesion Area After Sealing (%) |
| Example 1 | 2500 | 50 | 100 | 60 | 100 | 60 | 90 |
| Example 2 | 3200 | 50 | 100 | 50 | 100 | 50 | 100 |
| Comparative Example 1 | 1200 | 50 | 50 | 60 | 60 | 60 | 60 |
| Comparative Example 2 | 1600 | 50 | 50 | 50 | 50 | 50 | 50 |

As shown in table 1, both of the adhesive sheets in examples 1 and 2 have loss elastic moduli of 2000 Pa or more, and the adhesion area after sealing is 90% or more against all the adherends. On the other hand, both of the adhesive sheets in comparative examples 1 and 2 have loss elastic moduli of 2000 Pa or less, and there is no change in any of the adhesion areas after die-attaching and after sealing.

What is claimed is:

1. An adhesive sheet for fixing a semiconductor element on an adherend, wherein a loss elastic modulus at 175° C. before completely thermally curing is set to be 2000 Pa or more so that after temporarily fixing a semiconductor element on an adherend, fluidity of the adhesive sheet decreases and gets to a state of being fixed in which the adhesive sheet is completely thermally cured upon sealing the semiconductor element with a sealing resin, and pressure applied in the sealing with a resin reduces a gap existing between the semiconductor element and the adherend.

2. The adhesive sheet according to claim 1, wherein the adhesive sheet comprises a thermoplastic resin.

3. The adhesive sheet according to claim 2, wherein an acrylic resin is used as the thermoplastic resin.

4. The adhesive sheet according to claim 1, wherein the adhesive sheet includes both a thermosetting resin and a thermoplastic resin.

5. The adhesive sheet according to claim 4, wherein an acrylic resin is used as the thermoplastic resin.

6. The adhesive sheet according to claim 4, wherein, an epoxy resin and/or a phenol resin is used as the thermosetting resin.

7. The adhesive sheet according to claim 1, wherein a cross-linking agent is added to the adhesive sheet.

* * * * *

UNITED STATES PATENT AND TRADEMARK OFFICE
CERTIFICATE OF CORRECTION

| | | |
|---|---|---|
| PATENT NO. | : 8,975,759 B2 | Page 1 of 1 |
| APPLICATION NO. | : 13/615221 | |
| DATED | : March 10, 2015 | |
| INVENTOR(S) | : Misumi et al. | |

It is certified that error appears in the above-identified patent and that said Letters Patent is hereby corrected as shown below:

In the specification

Column 1 line 35, Change "at" to --of--.

Column 6 line 14, Change "the this" to --this--.

Column 7 line 62, Change "tris-glycicylisocyanurate" to --tris-glycidylisocyanurate--.

Column 8 line 62, Change "ametal" to --a metal--.

Column 12 line 4, Change "41'" to --41'.--.

Column 14 line 13, Change "industrial" to --Industrial--.

Signed and Sealed this
Fifteenth Day of December, 2015

Michelle K. Lee
*Director of the United States Patent and Trademark Office*